(12) United States Patent
Juengling

(10) Patent No.: US 8,293,602 B2
(45) Date of Patent: Oct. 23, 2012

(54) METHOD OF FABRICATING A FINFET HAVING CROSS-HAIR CELLS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 12/950,774

(22) Filed: Nov. 19, 2010

(65) Prior Publication Data

US 2012/0126338 A1  May 24, 2012

(51) Int. Cl.
*H01L 21/336* (2006.01)
*H01L 29/66* (2006.01)

(52) U.S. Cl. ........ 438/270; 438/283; 438/589; 257/331; 257/E21.158; 257/E21.421; 257/E29.111; 257/E29.264

(58) Field of Classification Search .......................... None
See application file for complete search history.

(56) References Cited

U.S. PATENT DOCUMENTS

| | | | |
|---|---|---|---|
| 5,674,769 A | 10/1997 | Alsmeier et al. | |
| 6,380,581 B1 | 4/2002 | Noble et al. | |
| 7,365,384 B2 | 4/2008 | Tran et al. | |
| 7,573,108 B2 | 8/2009 | Juengling | |
| 7,742,324 B2 | 6/2010 | Juengling | |
| 7,808,042 B2 | 10/2010 | Juengling | |
| 2006/0289919 A1 | 12/2006 | Juengling | |
| 2009/0206400 A1 | 8/2009 | Juengling | |
| 2009/0206443 A1 | 8/2009 | Juengling | |
| 2009/0224357 A1 | 9/2009 | Juengling | |
| 2009/0237996 A1 | 9/2009 | Kirsch et al. | |
| 2009/0238010 A1 | 9/2009 | Juengling | |
| 2009/0251946 A1 | 10/2009 | Juengling | |
| 2009/0273051 A1 | 11/2009 | Parekh et al. | |
| 2009/0294842 A1 | 12/2009 | Juengling | |
| 2010/0066440 A1 | 3/2010 | Juengling | |

OTHER PUBLICATIONS

U.S. Appl. No. 12/950,761, filed Nov. 19, 2010, Werner Juengling.
U.S. Appl. No. 12/950,787, filed Nov. 19, 2010, Werner Juengling.
U.S. Appl. No. 12/950,797, filed Nov. 19, 2010, Werner Juengling.
U.S. Appl. No. 12/702,123, filed Feb. 8, 2010, Werner Juengling.
U.S. Appl. No. 12/702,947, filed Feb. 9, 2010, Werner Juengling.

*Primary Examiner* — Alonzo Chambliss

(74) *Attorney, Agent, or Firm* — Fletcher Yoder

(57) ABSTRACT

Systems and methods are disclosed for manufacturing grounded gate cross-hair cells and standard cross-hair cells of fin field-effect transistors (finFETs). In one embodiment, a process may include forming gate trenches and gates on and parallel to row trenches in a substrate, wherein the gate trenches and gates are pitch-doubled such that four gate trenches are formed for every two row trenches. In another embodiment, a process may include forming gate trenches, gates, and grounded gates in a substrate, wherein the gate trenches and gates are formed such that three gate trenches are formed for every two row trenches.

19 Claims, 17 Drawing Sheets

METHOD OF FABRICATING A FINFET HAVING CROSS-HAIR CELLS

BACKGROUND

1. Field of Invention

Embodiments of the invention relate generally to electronic devices, and more specifically, to non-planar transistors and techniques for fabricating the same.

2. Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Fin field effect transistors (finFETs) are often built around a fin (e.g., a tall, thin semiconductive member) extending generally perpendicularly from a substrate. Typically, a gate traverses the fin by conformally running up one side of the fin over the top and down the other side of the fin. Generally, a source and a drain are located on opposite sides of the gate in the fin. In operation, a current through the fin between the source and drain is controlled by selectively biasing the gate.

High aspect ratio fins typically are desirable but challenging to construct. Generally, high aspect ratio finFETs can be integrated into a small area of the substrate, thereby potentially reducing manufacturing costs on a per-transistor basis. To increase density of the transistors, the width of each fin, and the gap between each fin, may be reduced. As the dimensions of the fin structures and the space between each fin are reduced, construction of gates or other structures, and operation and control of the transistors may be increasingly difficult.

DETAILED DESCRIPTION

Some of the subsequently discussed embodiments may include processes for the manufacture of high aspect ratio structures such as finFETs having gates and, in some embodiments, grounded gates. As described in detail below, in one embodiment the process may include the formation of gate trenches and gates disposed on row trenches between fins, such that four gate trenches are formed for every two row trenches (i.e., for two pitches of the row trenches). In another embodiment, the process may include the fabrication of gate trenches, access line gates, and grounded gates, such that three gate trenches are formed for every two row trenches (i.e., for two pitches of the row trenches). The following discussion describes devices and process flows in accordance with embodiments of the present technique.

Figure 1:
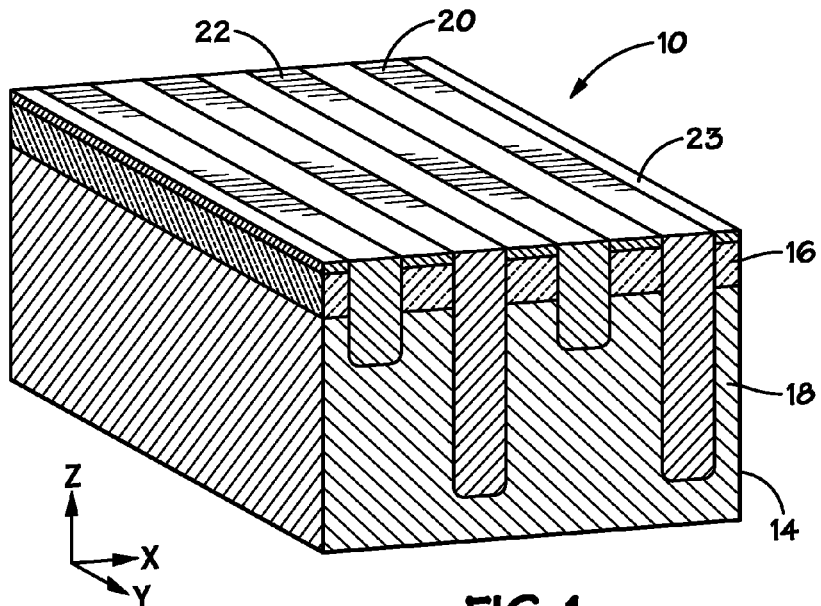
FIG. 1 depicts an embodiment of a portion of a semiconductor device in accordance with an embodiment of the present invention.

FIG. 1 depicts a cross-sectional plane view of a portion 10 of a memory array comprising high aspect ratio structures, e.g., fins, in accordance with an embodiment of the present invention. As used herein, the term "fin" refers to a tall, thin, semiconductor member extending from a substrate and generally having a length greater than the width and the depth of the fin. The portion 10 may include a substrate 14 having an upper doped region 16 and a lower doped region 18 formed in the substrate 14 by any suitable processes. The substrate 14 may include semiconductive materials such as single crystalline or poly crystalline silicon, gallium arsenide, indium phosphide, or other materials with semiconductor properties. Alternately, or additionally, the substrate 14 may include a non-semiconductor surface on which an electronic device may be constructed such as a plastic or ceramic work surface, for example. The substrate 14 may be in the form of a whole wafer, a portion of a diced wafer, or a portion of a diced wafer in a packaged electronic device, for instance.

The upper doped region 16 and the lower doped region 18 may be differently doped. For example, the upper doped region 16 may be an n+ material and the lower doped region 18 may be a p− material (referred to as a "p-well"). The depth of the upper doped region 16 may be generally uniform over a substantial portion of the substrate 14, such as throughout a substantial portion of an array area of a memory device, for example. The upper doped region 16 and lower doped region 18 may be formed by implanting or diffusing dopant materials. Alternatively, or additionally, one or both of these regions 16 and/or 18 may be doped during growth or deposition of all or part of the substrate 14, such as during epitaxial deposition of a semiconductive material or during growth of a semiconductive ingot from which wafers may be cut. As is explained below, the upper doped region 16 may form a source and a drain of an access device, e.g., a transistor, and the lower doped region 18 may form a channel of an access device, e.g., a transistor.

The array portion 10 may include deep isolation trenches 20 and shallow trenches 22 that may be formed in the substrate 14. These trenches 20 and 22 may generally extend in the y-direction, as indicated in FIG. 1. The deep isolation trenches 20 generally separate access devices, e.g., transistors, formed in the high aspect ratio structures, and the shallow trenches 22 generally separate the source and drain of a single access device. One or more shallow trenches 22 may be interposed between pairs of the deep isolation trenches 20. In some embodiments, the shallow trenches 22 may be deeper than the upper doped region 16 to separate sources and drains. Additionally, the deep isolation trenches 20 may be deeper than the shallow trenches 22 to isolate subsequently formed access devices, e.g., transistors. The deep isolation trenches 20 and/or shallow trenches 22 may have a generally rectangular or trapezoidal cross-section, and, in some embodiments, their cross-section may be generally uniform through some distance in the x-direction, for example through a distance larger than one, two, five, or more transistor lengths. The deep isolation trenches 20 and shallow trenches 22 may be partially or entirely filled with various dielectric materials, such as high density plasma (HDP) oxide, for instance, to electrically isolate features. Additionally, the deep isolation trenches 20 and/or shallow trenches 22 may include various liner materials, such as silicon nitride for example, to relieve film stresses, improve adhesion, and/or function as a barrier material. The array portion 10 may also include additional layers 23, such as a pad oxide, stop body such as a nitride, or other suitable layers.

Figure 2:
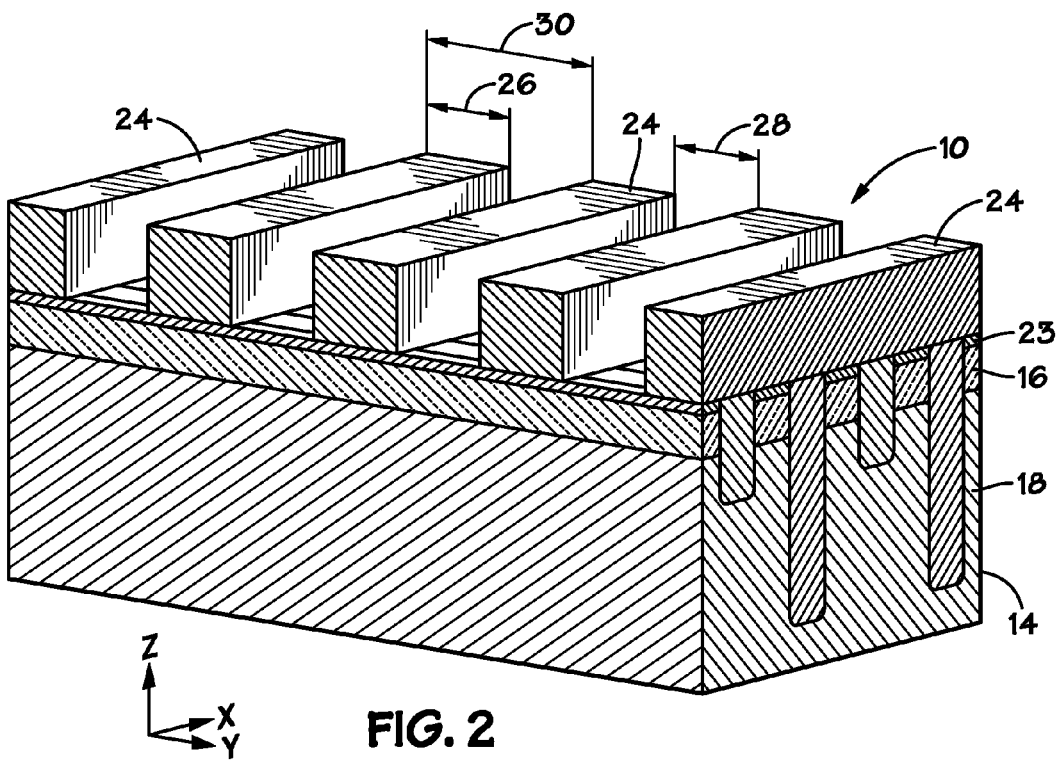
FIGS. 2-11 depict an embodiment of a process for forming fins and gates in an 8F2 architecture in accordance with an embodiment of the present invention.

As shown in FIG. 2, a row mask 24 may be formed on the array portion 10. The row mask 24 may be generally perpendicular to the deep isolation trenches 20 and the shallow trenches 22. The row mask 24 may be formed with photoresist or it may be a hard mask, for example, and it may be patterned with photolithography or other lithographic processes, e.g., nano-imprint lithography or electron-beam lithography. For example, the row mask 24 may be formed by patterning a body of amorphous carbon that is formed on the substrate 10. The amorphous carbon may be formed with a thickness less than about 3000 Å, e.g., a thickness less than or equal to about 2000 Å. The row mask 24 may define masked regions having a width 26 and exposed regions having a width 28. In some embodiments, the row mask 24 may be formed with a sub-photolithographic process, e.g., a sidewall-spacer process, a resist-reflow process, or a line-width thinning process. The widths 26 or 28 may be generally equal to or less than F, wherein F refers to the photolithographic-resolution limit or minimum achievable feature size. The row mask 24 may define a repeating pattern of lines with a pitch 30, or in some embodiments, the pattern may be interrupted by other structures. The masked regions of the row mask 24 may be generally straight, generally parallel to one another, and may generally extend in the x-direction. In other embodiments, the masked regions of the row mask 24 may undulate side to side or up and down, or they may be segmented.

Figure 3:
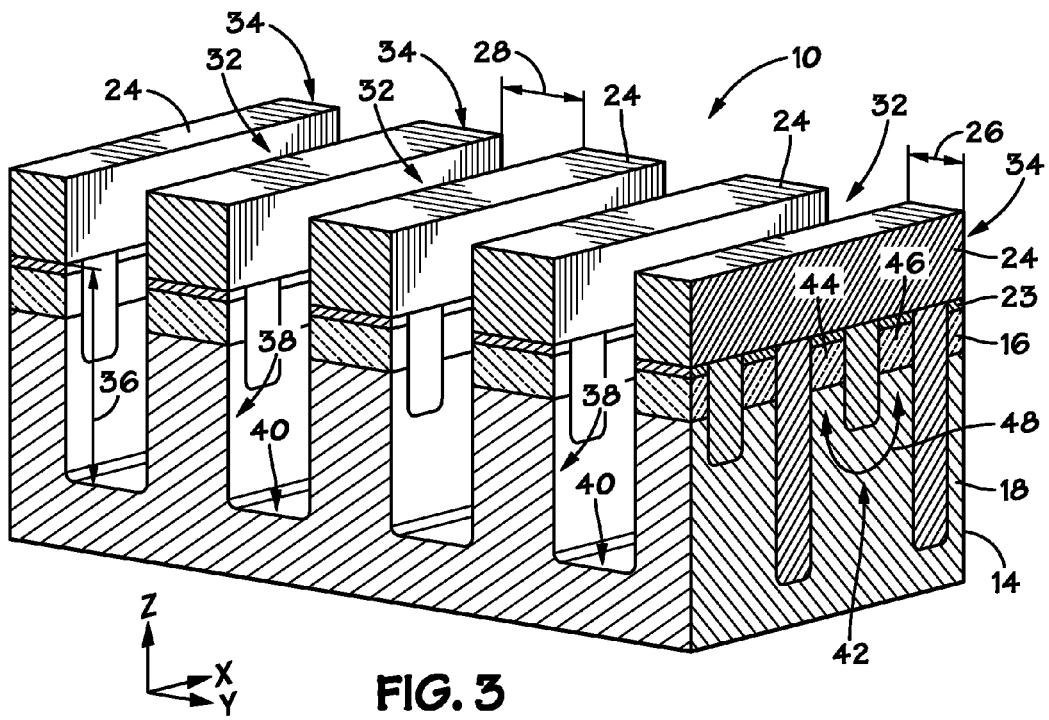

Next, row trenches 32 may be formed, as illustrated by FIG. 3. The row trenches 32 may define fins 34 formed under the masked region of the row mask 24. The row trenches 32 may be formed with a dry etch that etches the upper doped region 16, the lower doped region 16, the deep isolation trenches 20 and the shallow isolation trenches 22 at generally the same rate. The row trenches 32 may have a depth 36 that is less than a depth of the deep isolation trenches 20. The fins 34 may be generally defined by sidewalls 38 and bottom surfaces 40 of the trenches 32. In one embodiment, the width 26 of the fins 34 may be about 30 nanometers, 20 nanometers, or less, and the width 28 of the row trench 94 may be about 40 nanometers, 30 nanometers, or less.

The fins 34 may include a transistor 42 formed by a source 44 and drain 46 in the upper doped region 16 and a conductive channel 48 formed in the lower doped region 18. This structure may be referred to as a fin field-effect transistor (finFET). To activate the transistors 42 of a fin 34, a source to drain current is induced in the channel 48 by gates formed in the processes described below.

Figure 4:
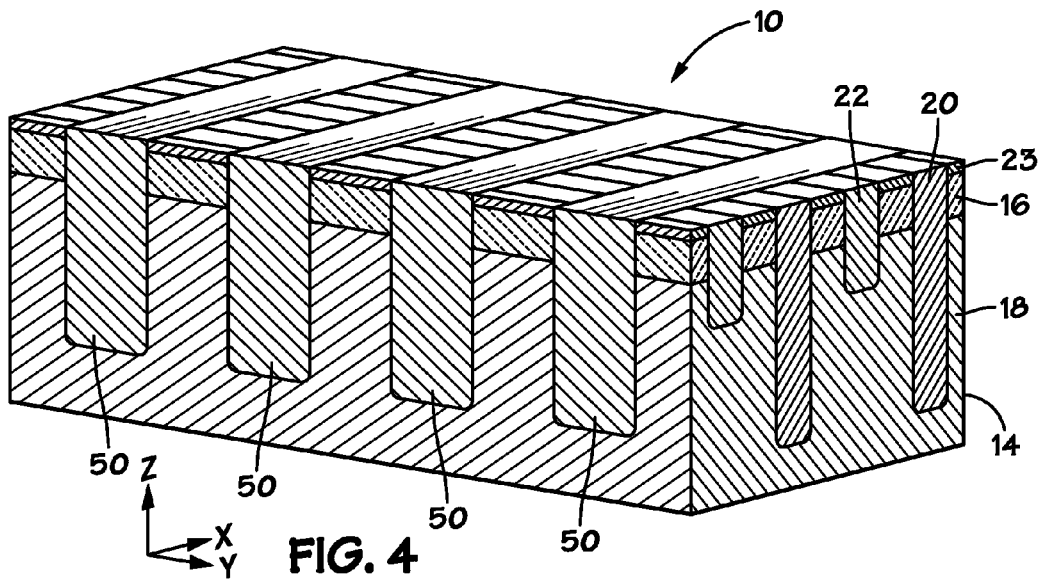

After removal of the row mask 24, a gate oxide 50 may be formed in the row trenches 24, as shown in FIG. 4. The gate oxide 50 may be deposited, grown, or otherwise formed, and it may substantially or entirely cover the exposed side portions of the upper doped region 16 and the lower doped region 18, such as on the bottom surfaces 40 of the trenches 24 and the sidewalls 38 of the fins 34. The gate oxide 50 may include a variety of dielectric materials, such as oxide (e.g., silicon dioxide), oxynitride, or high-dielectric constant materials like hafnium dioxide, zirconium dioxide, and titanium dioxide. As will be appreciated, after deposition, the gate oxide 50 may be etched or ground such that it is planar with respect to the upper surfaces of layer 23, as illustrated.

Figure 5:
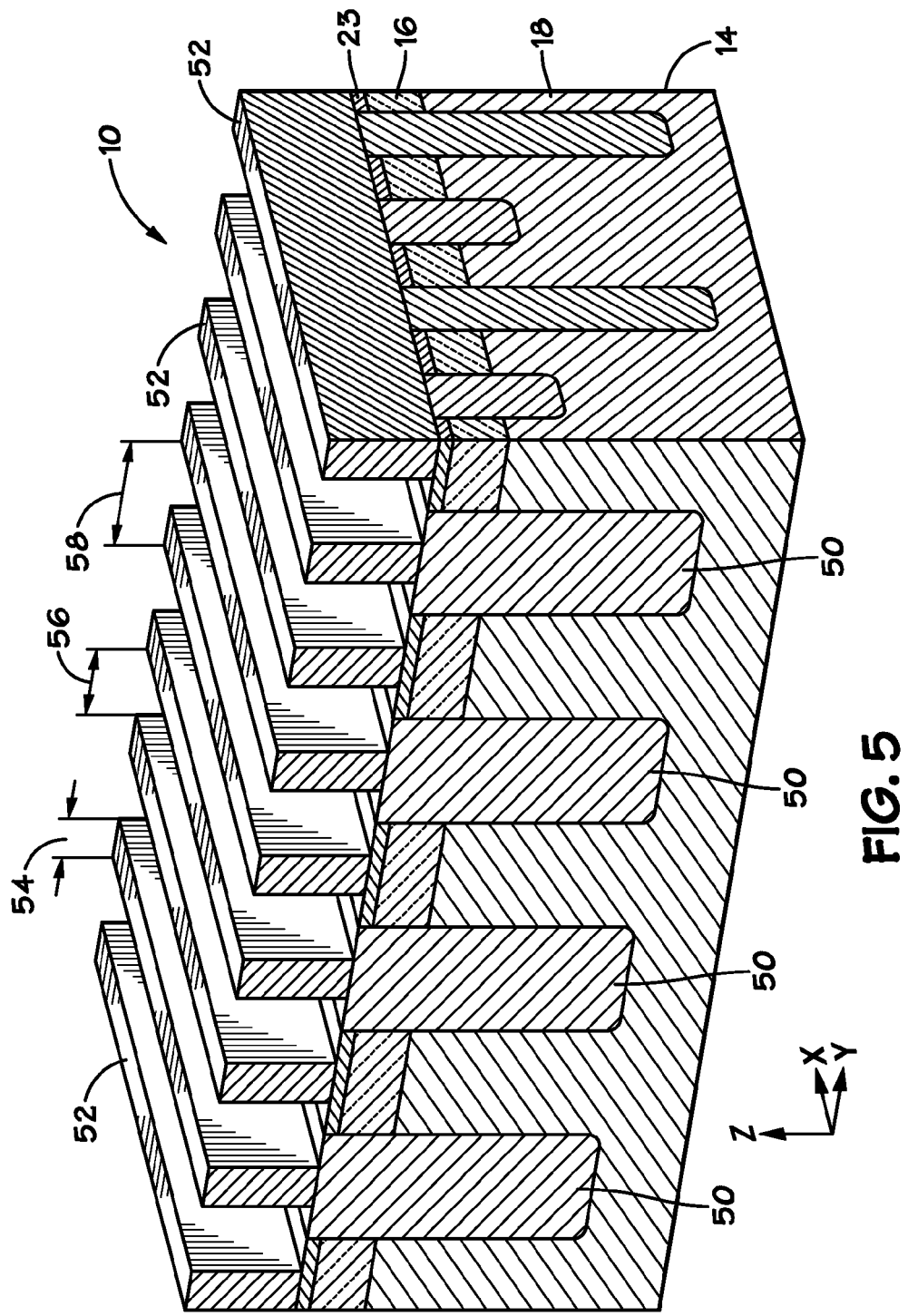

FIGS. 5-11 depict formation of gate trenches and gates to form access lines (e.g., wordlines) of the fins 34 in accordance with an embodiment of the present invention. Turning now to FIG. 5, a gate mask 52 may be formed on the array portion 10. The gate mask 52 may be generally perpendicular to the deep isolation trenches 20 and the shallow trenches 22. The gate mask 52 may be formed with photoresist or it may be a hard mask, for example, and it may be patterned with photolithography or other lithographic processes, e.g., nano-imprint lithography or electron-beam lithography. For example, the gate mask 52 may be formed by patterning a body of amorphous carbon that is formed on the substrate 10.

The gate mask 52 may define masked regions having a width 54 and exposed regions having a width 56. In some embodiments, the gate mask 52 may be formed with a sub-photolithographic process, e.g., a sidewall-spacer process, a resist-reflow process, or a line-width thinning process. The width 54 may be F/2, such that half of the masked regions mask a width of F/4 of each fin 34 and a width F/4 of the row trenches 32. The width 56 of the exposed regions may be F/2.

The gate mask 52 may define a repeating pattern of lines with a pitch 58, or in some embodiments, the pattern may be interrupted by other structures. As shown in FIG. 5, the gate mask 52 may be "pitch doubled" as compared to the pitch of the row trenches 24, such that there are two of the pitches 58 for every pitch 30. The masked regions of the gate mask 52 may be generally straight, generally parallel to one another, and may generally extend in the x-direction. In other embodiments, the masked regions of the gate mask 52 may undulate side to side or up and down, or they may be segmented.

Figure 6:
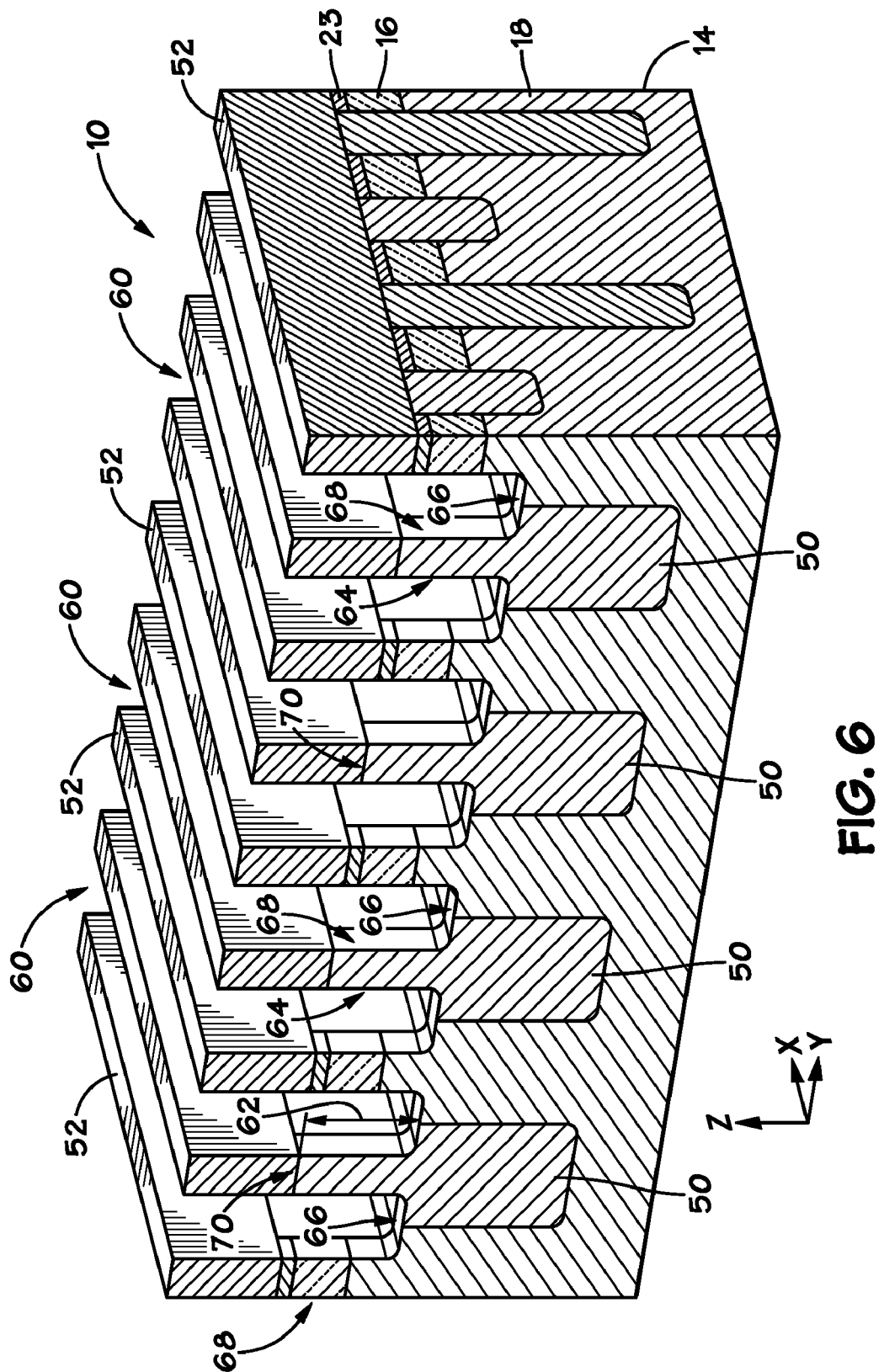

Next, gate trenches 60 may be formed overlying and parallel to the row trenches 32, as illustrated by FIG. 6. The gate trenches 60 may further define fins 34 under the masked region of the gate mask 52. The gate trenches 60 may be formed with a dry etch that etches the upper doped region 16, the lower doped region 18, and the oxide 50 at generally the same rate. The gate trenches 60 may have a depth 62 that is less than a depth of the deep isolation trenches 20 and equal to, greater than, or less than the depth of the shallow isolation trenches 22. After creation of the gate trenches 60, the fins 34 may be further defined by sidewalls 64 and bottom surfaces 66 of the trenches 60. The sidewalls 64 may define an upper portion 68 of the fins 34 having the width 54. In one embodiment, the width 54 may be about 15 nanometers, or less, and the width 56 of the gate trench may be about 15 nanometers or less.

The gate trenches 60 may also be separated by upper portions 70 of the oxide 50. As discussed further below, the upper portions 70 of the oxide 50 may provide electrical separate between gates of adjacent fins 34. As seen in FIG. 6, four gate trenches 60 may be formed for every two pitches of row trenches 32.

Figure 7:
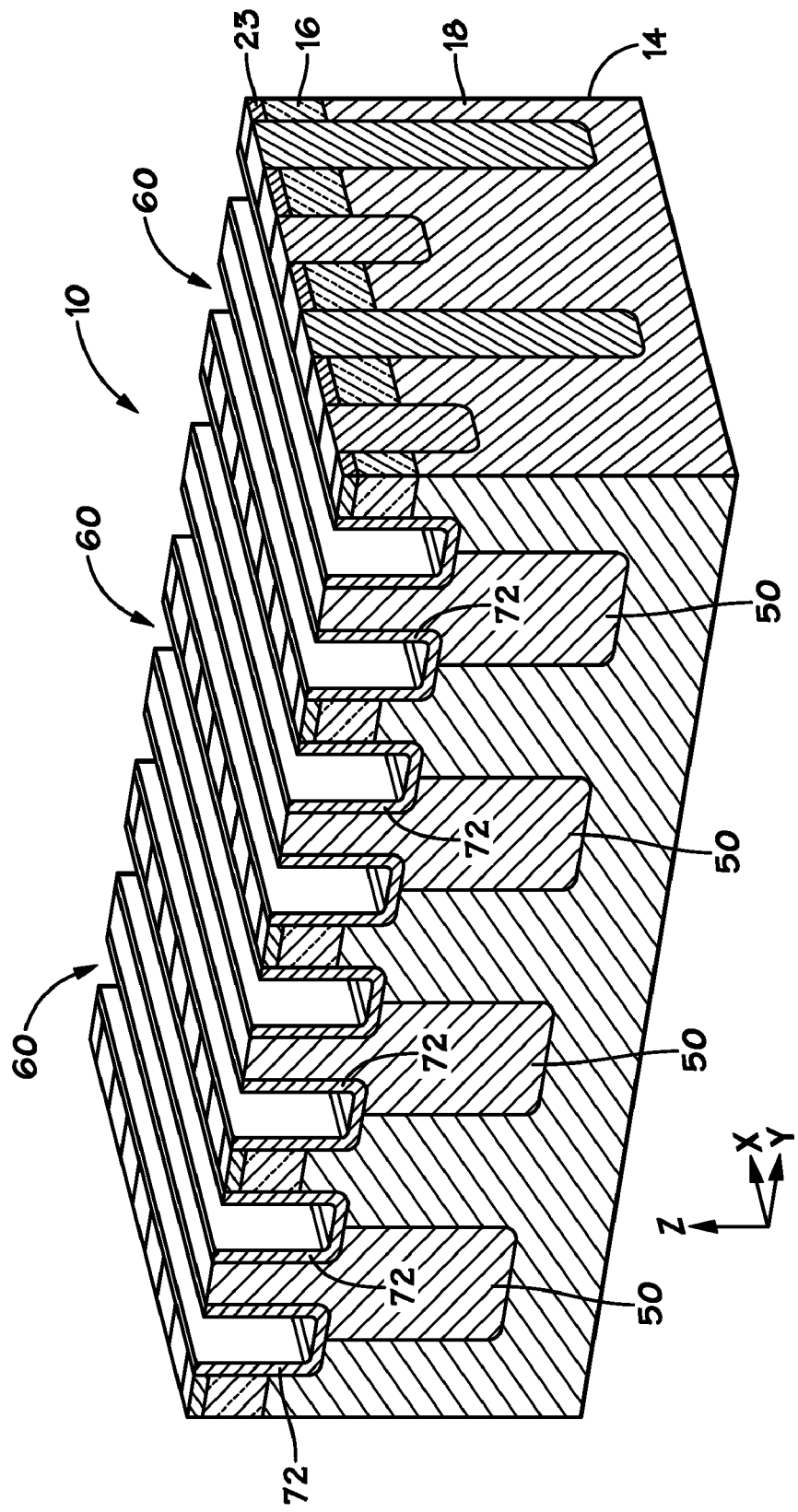

As shown in FIG. 7, after removal of the gate mask 52, a gate oxide 72 may be formed on the sidewalls 64 and the bottom portions 66 of the gate trenches 60. The gate oxide 72 may be deposited, grown, or otherwise formed, and it may substantially or entirely cover the portions of the upper doped region 16 and the lower doped region 18 exposed in the gate trenches 60. The gate oxide 72 may include a variety of dielectric materials, such as oxide (e.g., silicon dioxide), oxynitride, or high-dielectric constant materials like hafnium dioxide, zirconium dioxide, and titanium dioxide. The gate oxide 72 may have a thickness less than about 60 Å, e.g., a thickness equal to or less than about 30 Å.

Figure 8:
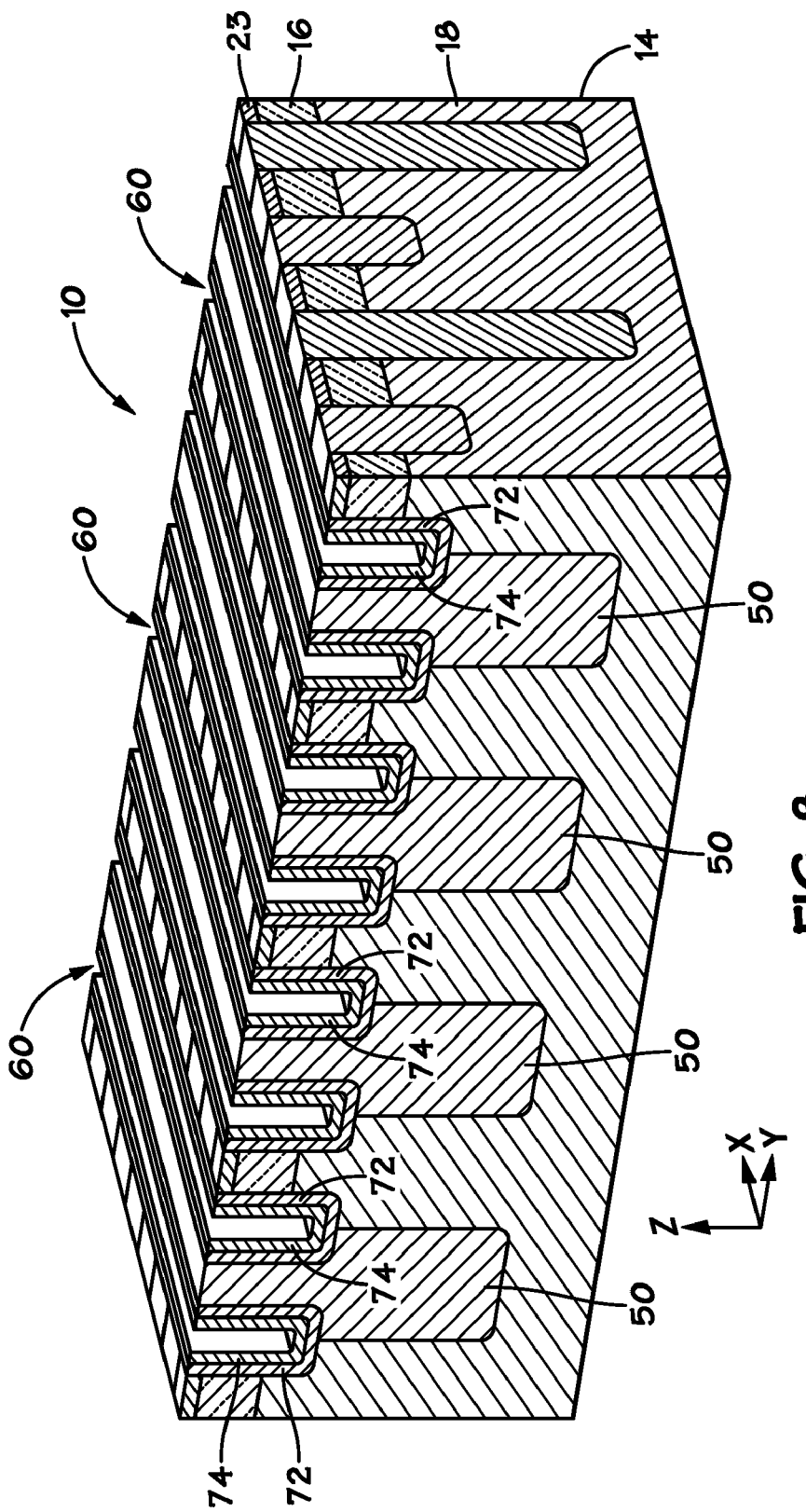

Next, in FIG. 8, a liner 74 may be formed on the gate oxide 72 in accordance with an embodiment of the present invention. As shown in FIG. 8, the liner 74 may be formed on the sidewalls 64 and the bottom portions 66 of the gate trenches 60. The liner 74 may include titanium nitride (TiN), tungsten nitride, or other appropriate conductive materials or combination thereof.

Figure 9:
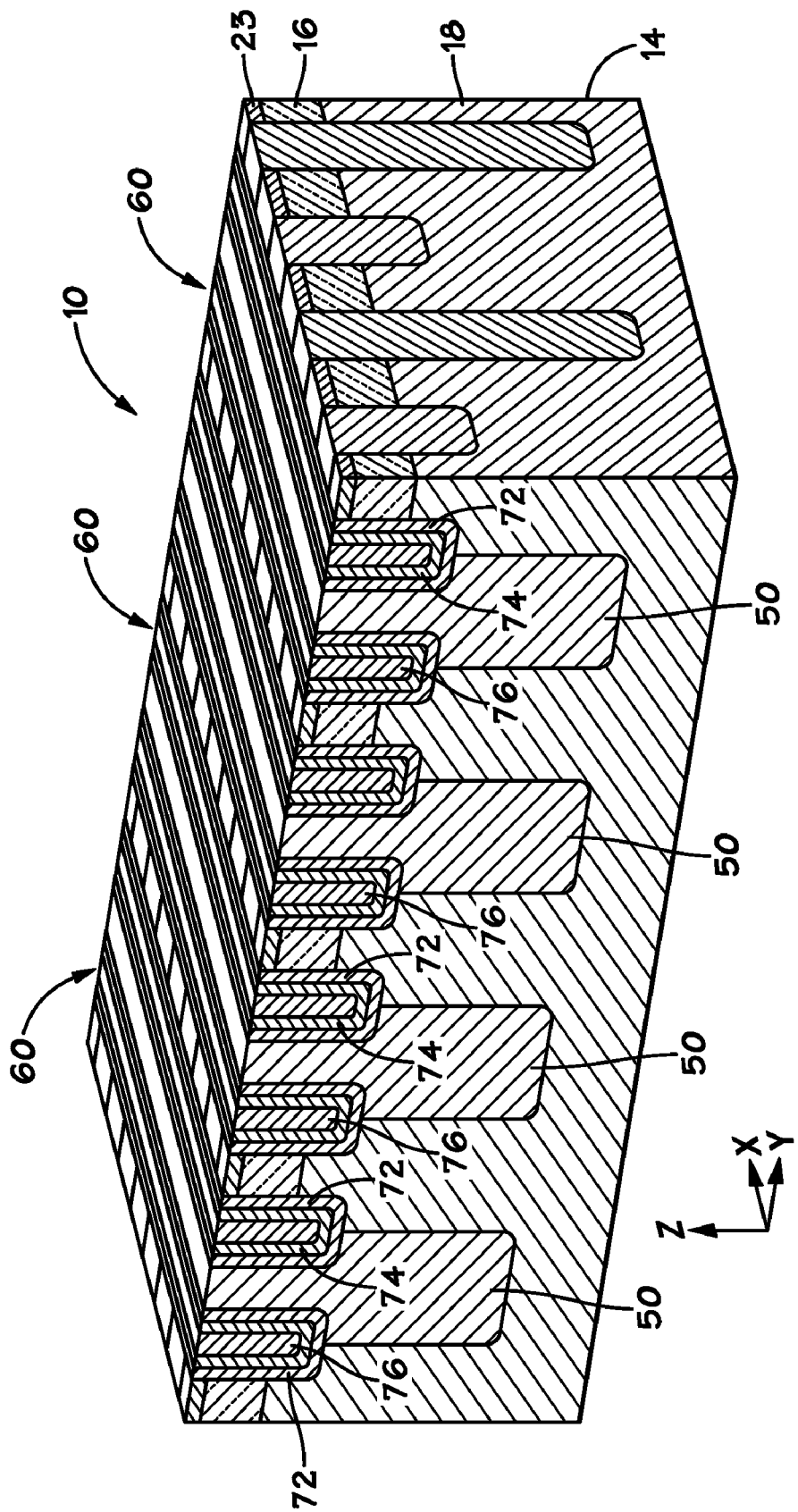

As shown in FIG. 9, a conductor 76 may be formed on the array portion 10 in accordance with an embodiment of the present invention. The conductor 76 may fill the gate trenches 60. The conductor 76 is deposited on top of the liner 74. As will be appreciated, only that portion of the conductor 76 in the trenches 76 is illustrated. The conductor 76 may include tungsten, ruthenium (Ru), or other appropriate conductive materials or combination thereof. For example, in one embodiment, titanium nitride liner 74 may be disposed on the gate oxide 72, and tungsten may be disposed on the titanium nitride liner 74 to form the conductor 76. As discussed further below, etching of the conductor 76 may form gates (e.g., access lines) in the gate trenches 60 on the sidewalls 64 of the upper portion 68 of the fins 34.

Figure 10:
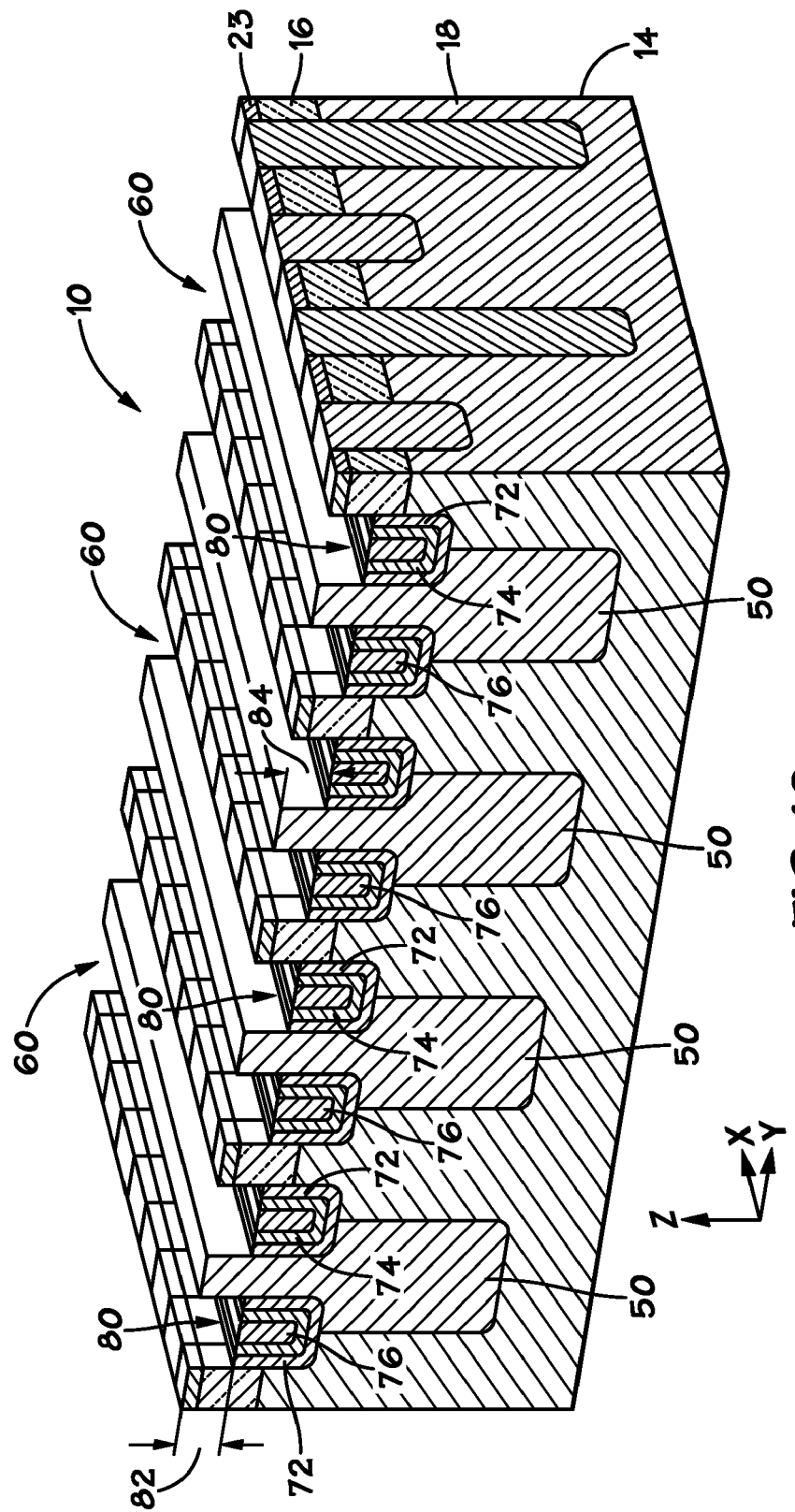

FIG. 10 depicts the array portion 10 after a removal of a portion of the conductor 76, the liner 74, and the gate oxide 72 to form gates 80 in accordance with an embodiment of the present invention. The gates 80 on either sidewall 64 of the fins 32 may connect to one another, e.g., by wrapping around the ends (not shown) of the fins 34, or they may be electrically independent. As shown in FIG. 10, the liner 74 and the gate oxide 72 may be removed along the sidewalls 64 to a depth 82. The conductor 76 may be removed to a depth 84 in the trenches 60. The conductor 76, the liner 74, and the gate oxide 72 may be removed by one of or a combination of etch processes, such as wet etch, dry etch, or other suitable processes. The duration of the etch may control the depth (e.g., distance) of the etch into the gate trenches 60. Additionally, in some embodiments, differing etch rates of the different materials may result in different depths 82 and 84. For example, as shown in FIG. 10, after etching, the conductor 76 may protrude slightly above the gate oxide 76 and the liner 74, such that the depth 82 is less than the depth 84. In other embodiments, the depth 82 may be equal to or greater than the depth 84.

Figure 11:
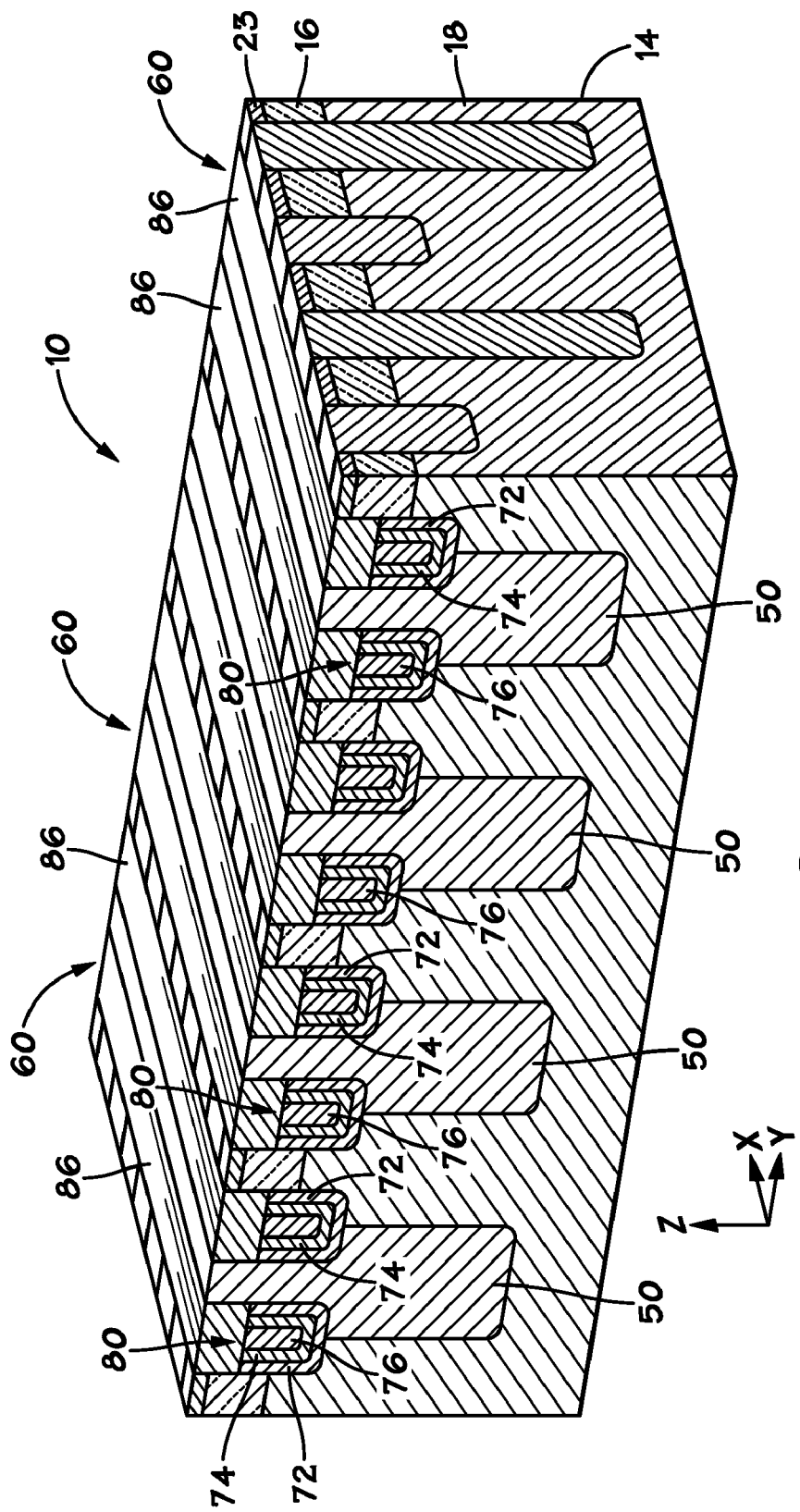

After forming the gates 80, a dielectric 86 may be formed on the array portion 10, as illustrated by FIG. 11. The dielectric 86 may be formed with an overburden and subsequently planarized to increase the likelihood of covering the gates 80 over a substantial portion of the portion 10. The dielectric 56 may include an oxide formed with TEOS CVD or other appropriate materials. Planarization may include processing the substrate 10 with a CMP process, an etch-back process, or other processes that planarize. The planarization process may stop on or in the upper doped region 16, removing the overburden of the dielectric 86. The gates 80 may be used to activate the transistors 42 of the fins 34. Such a device may be referred to as a double-sided "cross-hair cell" as each side of a fin is adjacent to an access line (e.g., gates 80) that connects (i.e., forms a cross-point or cross-hair) with an access device (e.g., the transistors 42 of fins 34).

Figure 12:
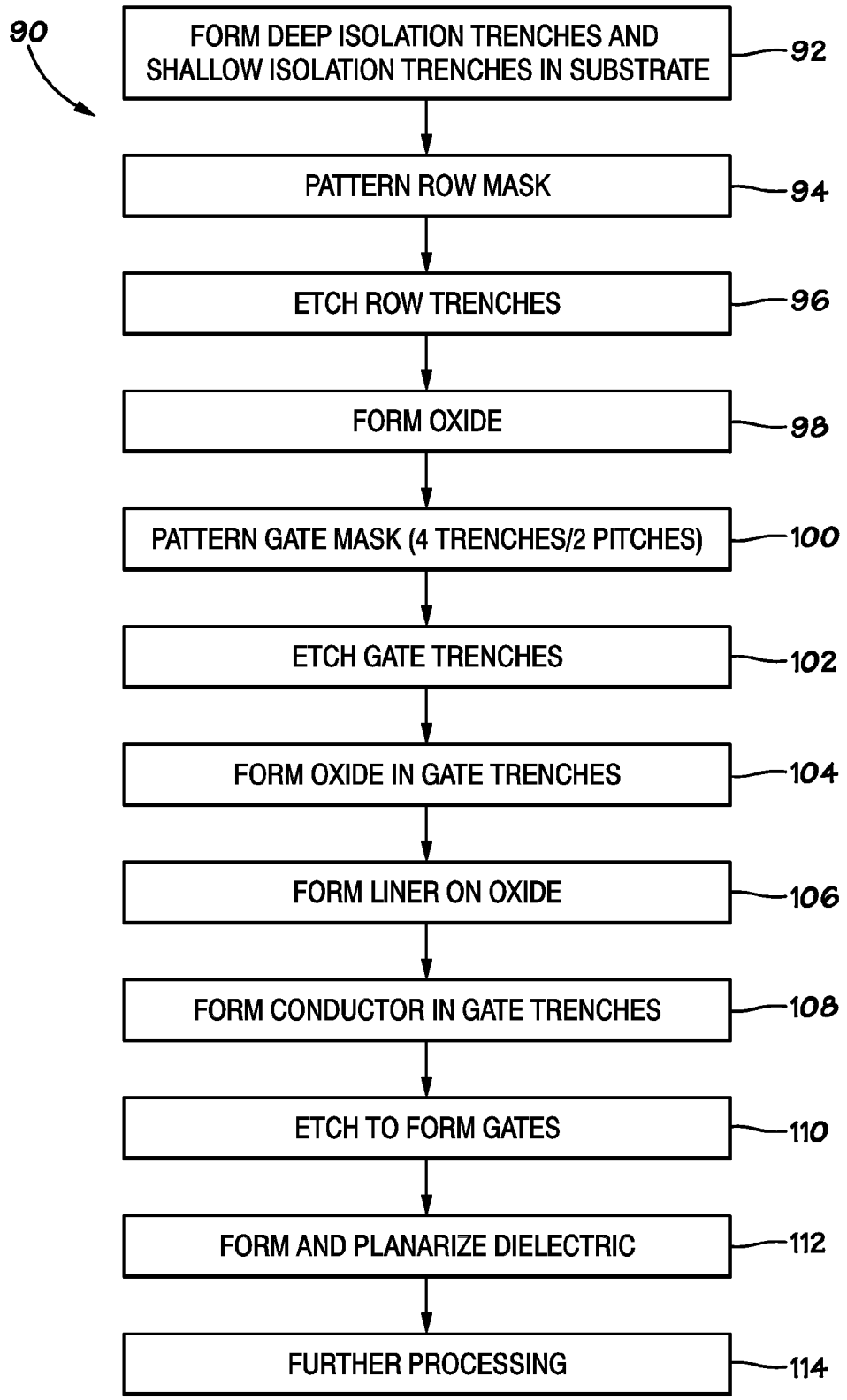
FIG. 12 is a flowchart depicting the manufacturing process of FIGS. 2-11 in accordance with an embodiment of the present invention.

FIG. 12 is a flowchart of a manufacturing process 90 in accordance with the embodiments depicted above in FIGS. 1-11. As described above in FIG. 1, deep isolation trenches 20 and shallow isolation trenches 22 may be formed in the substrate 14 by any suitable process (block 92). A row mask may be patterned on the array portion 10 (block 94), as shown in FIG. 2, and row trenches may be etched into the substrate to form row trenches and fins (block 96), as shown in FIG. 3. Next, the row trenches may be filled with an oxide 50 (block 98), as shown in FIG. 4.

After formation of the row trenches, a gate mask may be patterned on the array portion 10 (block 100), as shown in FIG. 5. As shown in FIG. 6, gate trenches may be etched into the substrate 14 to form gate trenches and upper portions of the fins (block 102). After formation of the gate trenches, an oxide may be formed in the gate trenches on the sidewalls and bottom surfaces of the gate trenches (block 104), as shown in FIG. 7. A liner may be formed on the oxide (block 106), and a conductor may be deposited in the gate trenches and on the liner (block 108), as shown in FIGS. 8 and 9. As depicted in FIG. 10, the conductor may be etched to a desired depth to form gates (block 110). After formation of the gates (block 110), a dielectric may be formed on the array portion 10 and the portion 10 may be planarized (block 112). As will be appreciated by those of ordinary skill in the art, the array portion 10 may be subjected to further processing, such as the formation of digitlines and storage devices accessible by the transistors of the fins 34 may be formed on the array portion 10 (block 114).

Figure 13:
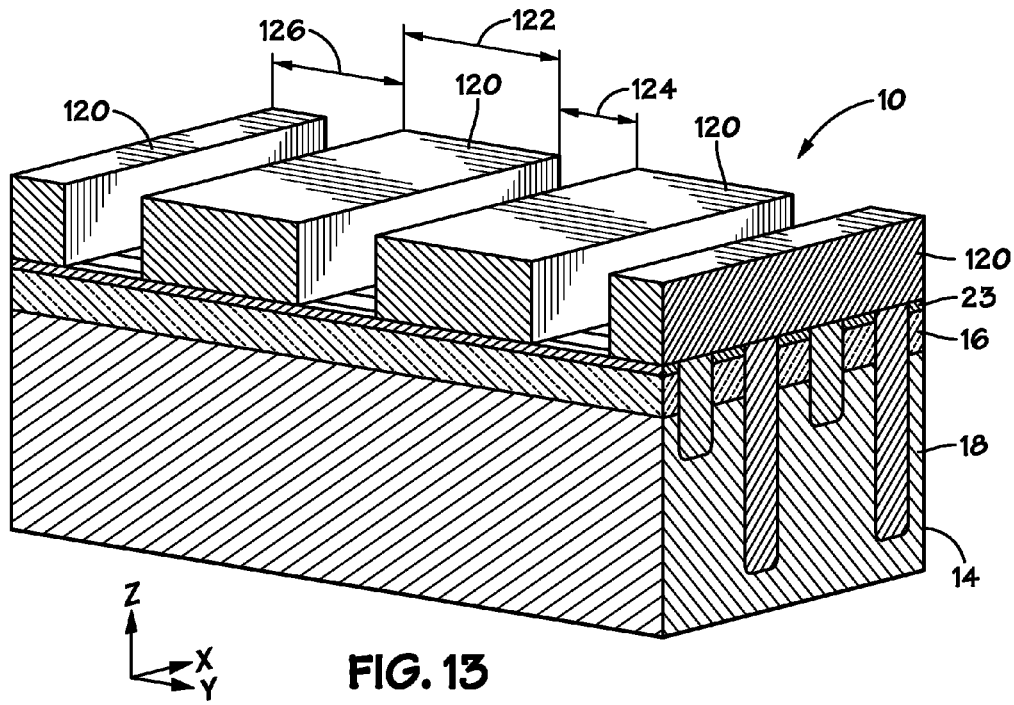
FIGS. 13-22 depict an embodiment of process for forming fins, gates, and grounded gates in accordance with an embodiment of the present invention.

In other embodiments, the array portion 10 of FIG. 1 may be processed to form gates and grounded gates of a finFET semiconductor device. FIGS. 13-20 depict formation of gate trenches and grounded gates, such as in a 6F2 architecture, in accordance with an embodiment of the present invention. As shown in FIG. 13, a row mask 120 may be formed on the array portion 10. As noted above, the row mask 120 may be generally perpendicular to the deep isolation trenches 20 and the shallow trenches 22. The row mask 120 may be formed with photoresist or it may be a hard mask, for example, and it may be patterned with photolithography or other lithographic processes, e.g., nano-imprint lithography or electron-beam lithography. For example, the row mask 120 may be formed by patterning a body of amorphous carbon that is formed on the substrate 10. The amorphous carbon may be formed with a thickness less than about 3000 Å, e.g., a thickness less than or equal to about 2000 Å. The row mask 120 may define masked regions having a width 122 and exposed regions having a width 124. In some embodiments, the row mask 120 may be formed with a sub-photolithographic process, e.g., a sidewall-spacer process, a resist-reflow process, or a line-width thinning process. The widths 122 or 124 may be generally equal to or less than F. The row mask 120 may define a repeating pattern of lines with a pitch 126, or in some embodiments, the pattern may be interrupted by other structures. The masked regions of the row mask 120 may be generally straight, generally parallel to one another, and may generally extend in the x-direction. In other embodiments, the masked regions of the row mask 120 may undulate side to side or up and down, or they may be segmented.

Figure 14:
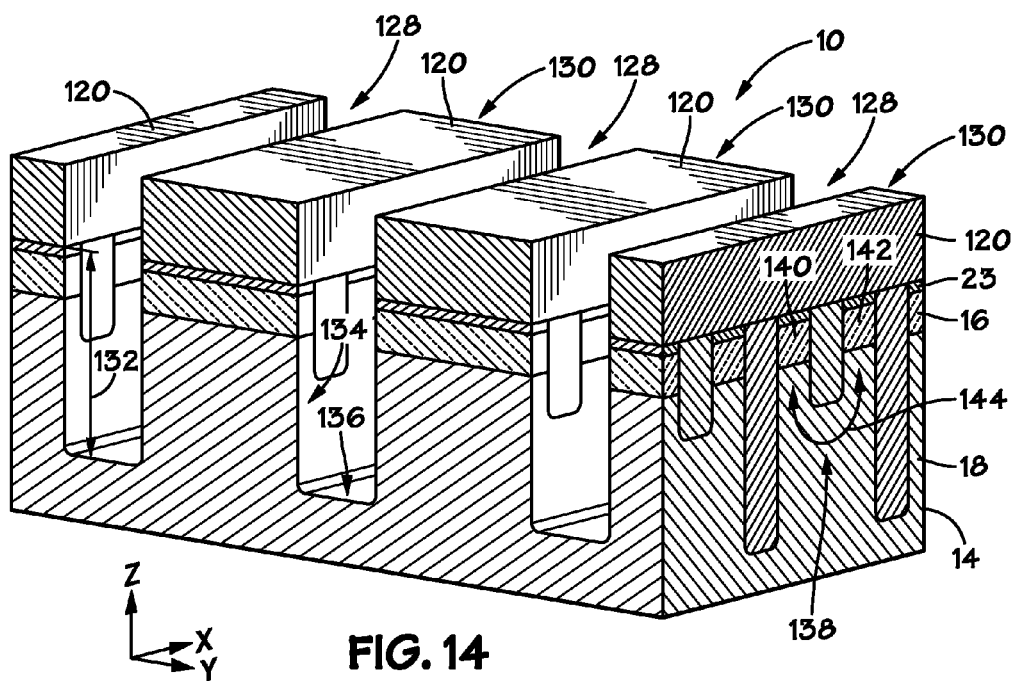

Next, row trenches 128 may be formed, as illustrated by FIG. 14. The row trenches 128 may define fins 130 formed under the masked region of the row mask 120. The row trenches 128 may be formed with a dry etch that etches the upper doped region 16, the lower doped region 18, the deep isolation trenches 20 and the shallow isolation trenches 22 at generally the same rate. The row trenches 128 may have a depth 132 that is less than a depth of the deep isolation trenches 20. The fins 130 may be generally defined by sidewalls 134 and bottom surfaces 136 of the trenches 128. In one embodiment, the width of the fins 130, defined by the row mask 120, may be about 30 nanometers, 20 nanometers, or less, and the width 124 of each of the row trenches 128 may be about 40 nanometers, 30 nanometers, or less.

As noted above, the fins 130 may include a transistor 138 formed by a source 140 and drain 142 in the upper doped region 16 and a conductive channel 144 formed in the lower doped region 18, i.e., a finFET. To activate the transistors 138 of a fin 130, a source to drain current is induced in the channel 144 by gates subsequently formed in the processes described below.

Figure 15:
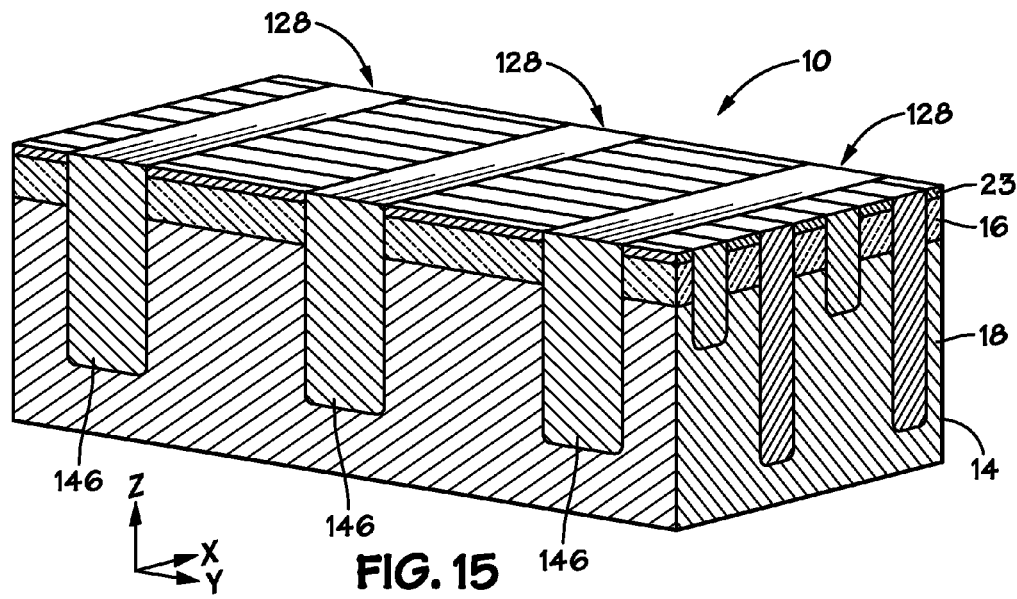

After removal of the row mask 120, a gate oxide 146 may be formed in the row trenches 128, as shown in FIG. 15. The gate oxide 146 may be deposited, grown, or otherwise formed, and it may substantially or entirely cover the exposed side portions of the upper doped region 16 and the lower doped region 18, such as on the bottom surfaces 136 of the trenches 128 and the sidewalls 134 of the fins 130. The gate oxide 146 may include a variety of dielectric materials, such as oxide (e.g., silicon dioxide), oxynitride, or high-dielectric constant materials like hafnium dioxide, zirconium dioxide, and titanium dioxide. As will be appreciated, after deposition, the gate oxide 146 may be etched or ground such that it is planar with respect to the upper surfaces of layer 23, as illustrated.

Figure 16:
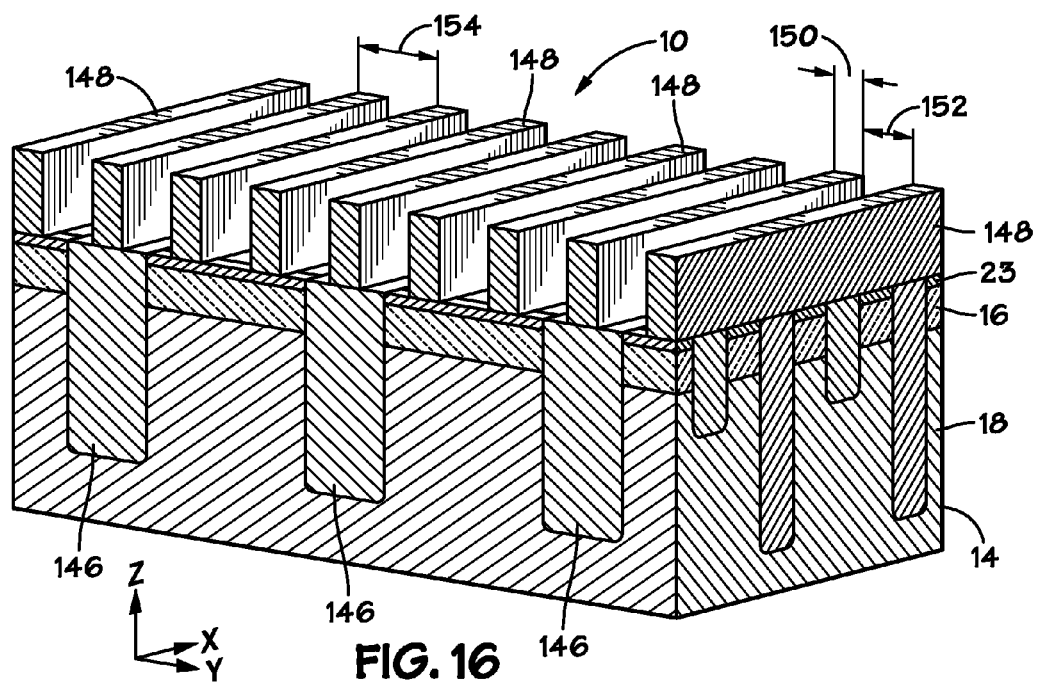

FIGS. 16-23 depict formation of gate trenches and gates to form grounded gate and access line gates of the fins 130 in accordance with an embodiment of the present invention. Turning now to FIG. 16, a gate mask 148 may be formed on the array portion 10. The gate mask 148 may be generally perpendicular to the deep isolation trenches 20 and the shallow trenches 22. The gate mask 148 may be formed with photoresist or it may be a hard mask, for example, and it may be patterned with photolithography or other lithographic processes, e.g., nano-imprint lithography or electron-beam lithography. For example, the gate mask 148 may be formed by patterning a body of amorphous carbon that is formed on the substrate 10.

The gate mask 148 may define masked regions having a width 150 and exposed regions having a width 152. In some embodiments, the gate mask 148 may be formed with a sub-photolithographic process, e.g., a sidewall-spacer process, a resist-reflow process, or a line-width thinning process. The width 150 may be F/2, such that half of the masked regions mask a width of F/4 of each fin 130 and a width F/4 of the row trenches 128. The width 152 of the exposed regions may be F/2.

The gate mask 148 may define a repeating pattern of lines with a pitch 154 or in some embodiments; the pattern may be interrupted by other structures. As shown in FIG. 5, the gate mask 148 may be "pitch doubled" as compared to the pitch of the row trenches 128, such that there are two of the pitches 154 for every pitch 126. The masked regions of the gate mask 148 may be generally straight, generally parallel to one another, and may generally extend in the x-direction. In other embodiments, the masked regions of the gate mask 148 may undulate side to side or up and down, or they may be segmented.

Figure 17:
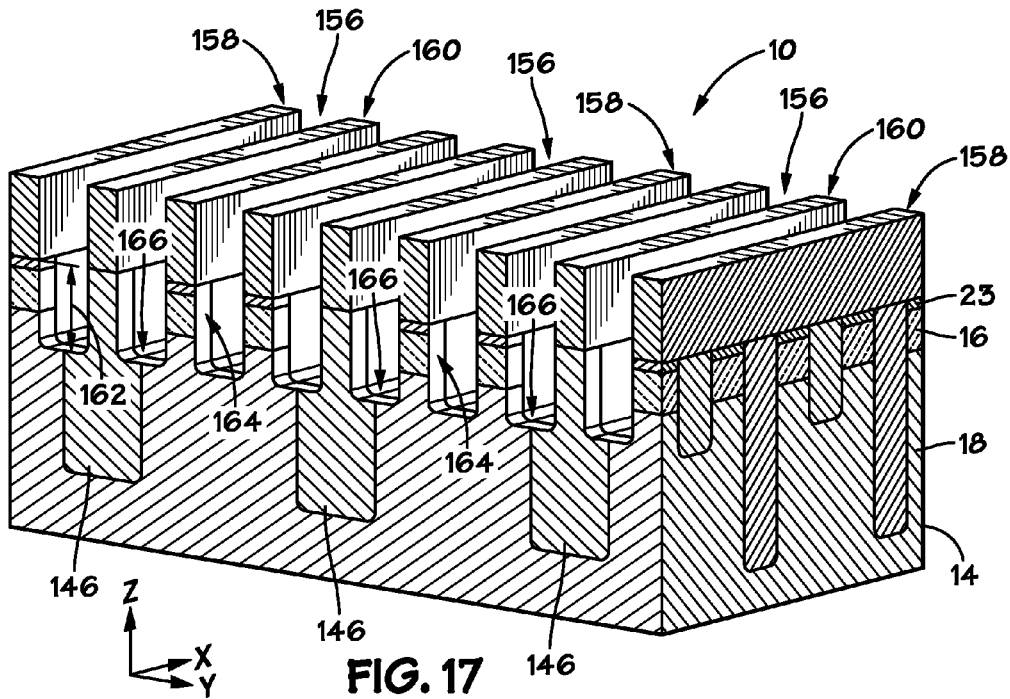

Next, gate trenches 156 may be formed on and parallel to the fins 130 and row trenches 128, as illustrated by FIG. 17. The gate trenches 156 may further define fins 130 into second fins 158 under the masked region of the gate mask 148. Additionally, the gate trenches 156 may define fin-shaped oxide portions 160 under those regions of the gate mask 148 overlying the oxide 146.

The gate trenches 156 may be formed with a dry etch that etches the upper doped region 16, the lower doped region 18, and the oxide 146 at generally the same rate. The gate trenches 156 may have a depth 162 that is less than a depth of the deep isolation trenches 20 and equal to, greater than, or less than the depth of the shallow isolation trenches 22. After creation of the gate trenches 156, the fins 158 may be defined by sidewalls 164 and bottom surfaces 166 of the trenches 156. In one embodiment, the width 150 of the fins 34 may be about 15 nanometers, or less, and the width 152 of the gate trench may be about 15 nanometers or less. As discussed further below, some of the gate trenches 156 may provide for the formation of access line gates of the fins 158, and some of the gate trenches 156 may provide for the formation of grounded gates.

Figure 18:
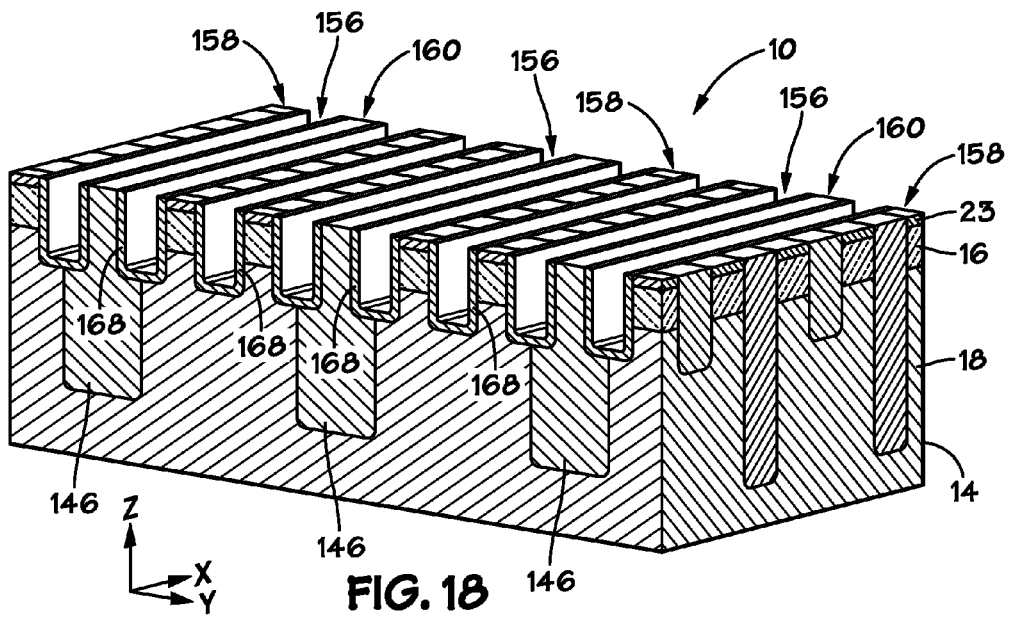

As shown in FIG. 18, after removal of the gate mask 148, a gate oxide 168 may be formed on the sidewalls 164 and the bottom portions 166 of the gate trenches 156. The gate oxide 168 may be deposited, grown, or otherwise formed, and it may substantially or entirely cover the portions of the upper doped region 16 and the lower doped region 18 exposed in the gate trenches 156. The gate oxide 168 may include a variety of dielectric materials, such as oxide (e.g., silicon dioxide), oxynitride, or high-dielectric constant materials like hafnium dioxide, zirconium dioxide, and titanium dioxide. The gate oxide 168 may have a thickness less than about 60 Å, e.g., a thickness equal to or less than about 30 Å.

Figure 19:
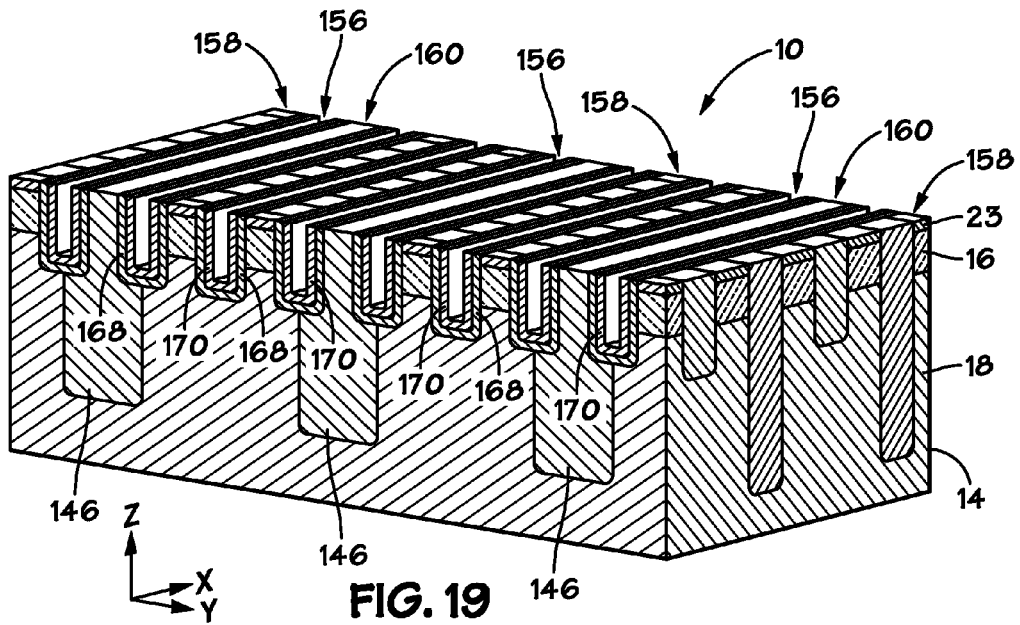

Next, in FIG. 19, a liner 170 may be formed on the gate oxide 168 in accordance with an embodiment of the present invention. As shown in FIG. 19, the liner 170 may be formed on the sidewalls 164 of and the bottom portions 166 of the gate trenches 156. The liner 170 may include titanium nitride (TiN), tungsten nitride, or other appropriate conductive materials or combination thereof.

Figure 20:
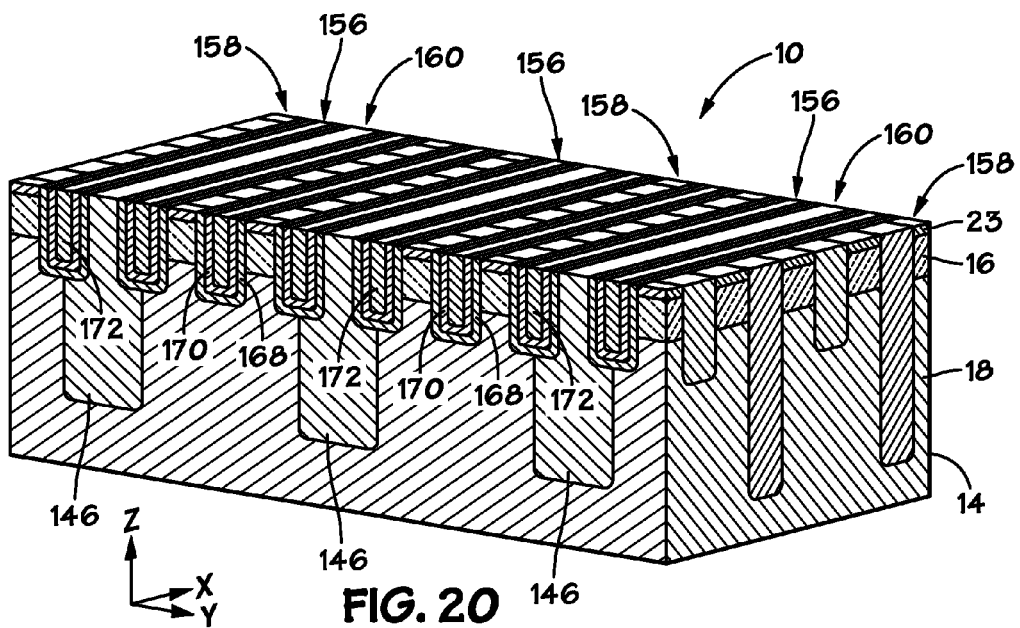

As shown in FIG. 20, a conductor 172 may be formed on the array portion 10 in accordance with an embodiment of the present invention. The conductor 172 may fill the gate trenches 156. The conductor 172 is deposited on top of the liner 170. As will be appreciated, only that portion of the conductor 172 in the trenches 156 is illustrated. The conductor 172 may include tungsten, ruthenium (Ru), or other appropriate conductive materials or combination thereof. For example, in one embodiment, titanium nitride liner 170 may be disposed on the gate oxide 168, and tungsten may be disposed on the titanium nitride liner 170 to form the conductor 172. As discussed further below, etching of the conductor 172 may form access lines and grounded gates in the gate trenches 156 on the sidewalls 164 of the fins 34.

Figure 21:
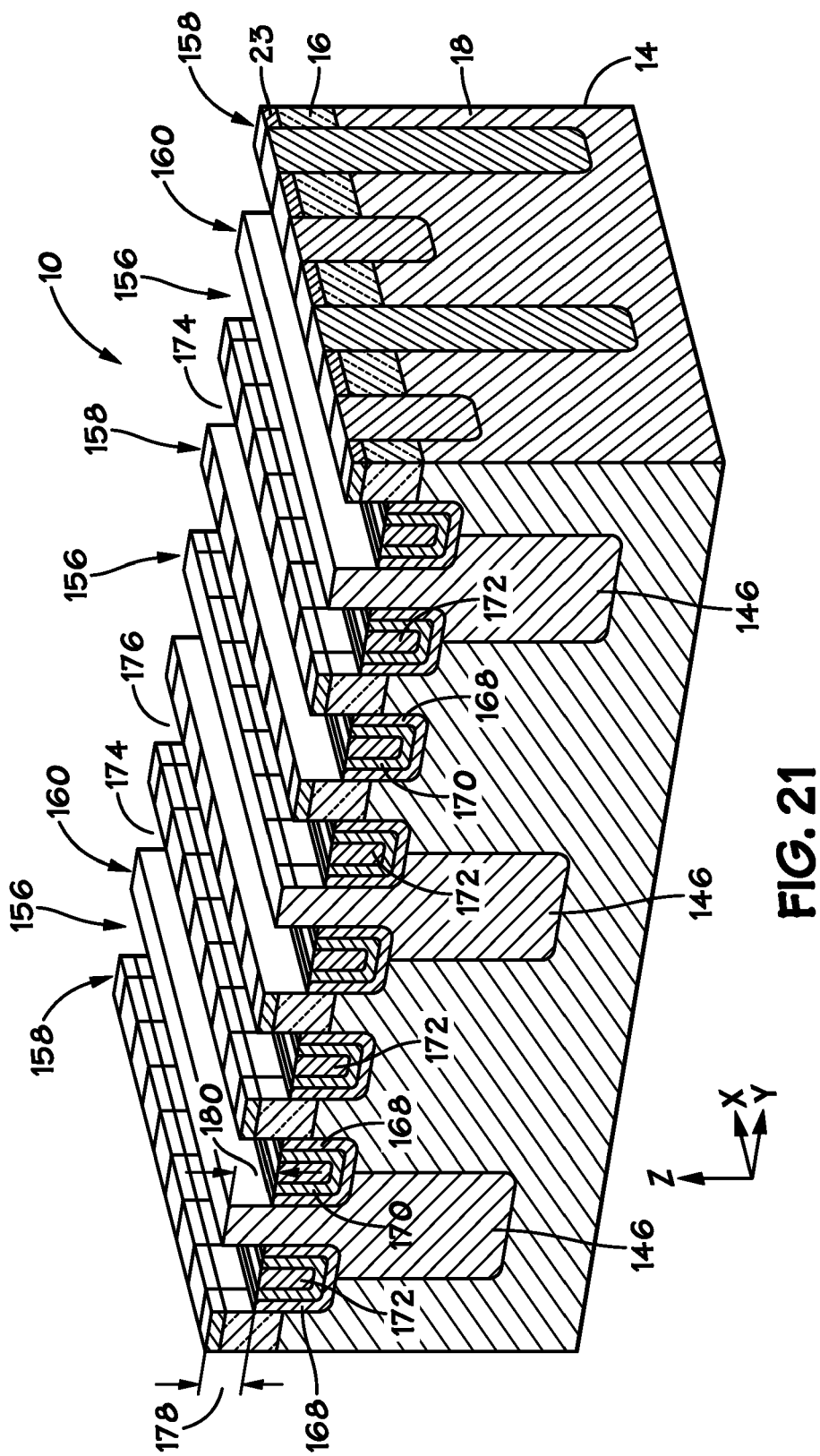

FIG. 21 depicts the array portion 10 after a removal of a portion of the conductor 172, the liner 170, and the gate oxide 168 to form gates 174 and 176 in accordance with an embodiment of the present invention. As shown in FIG. 21, the liner 170 and the gate oxide 168 may be removed along the sidewalls 164 to a depth 178. The conductor 172 may be removed to a depth 180 in the trenches 156. The conductor 172, the liner 170, and the gate oxide 168 may be removed by one of or a combination of etch processes, such as wet etch, dry etch, or other suitable processes. The duration of the etch may control the depth (e.g., distance) of the etch into the gate trenches 156. Additionally, in some embodiments, differing etch rates of the different materials may result in different depths 178 and 180, or the depths 178 and 180 may be equal.

Figure 22:
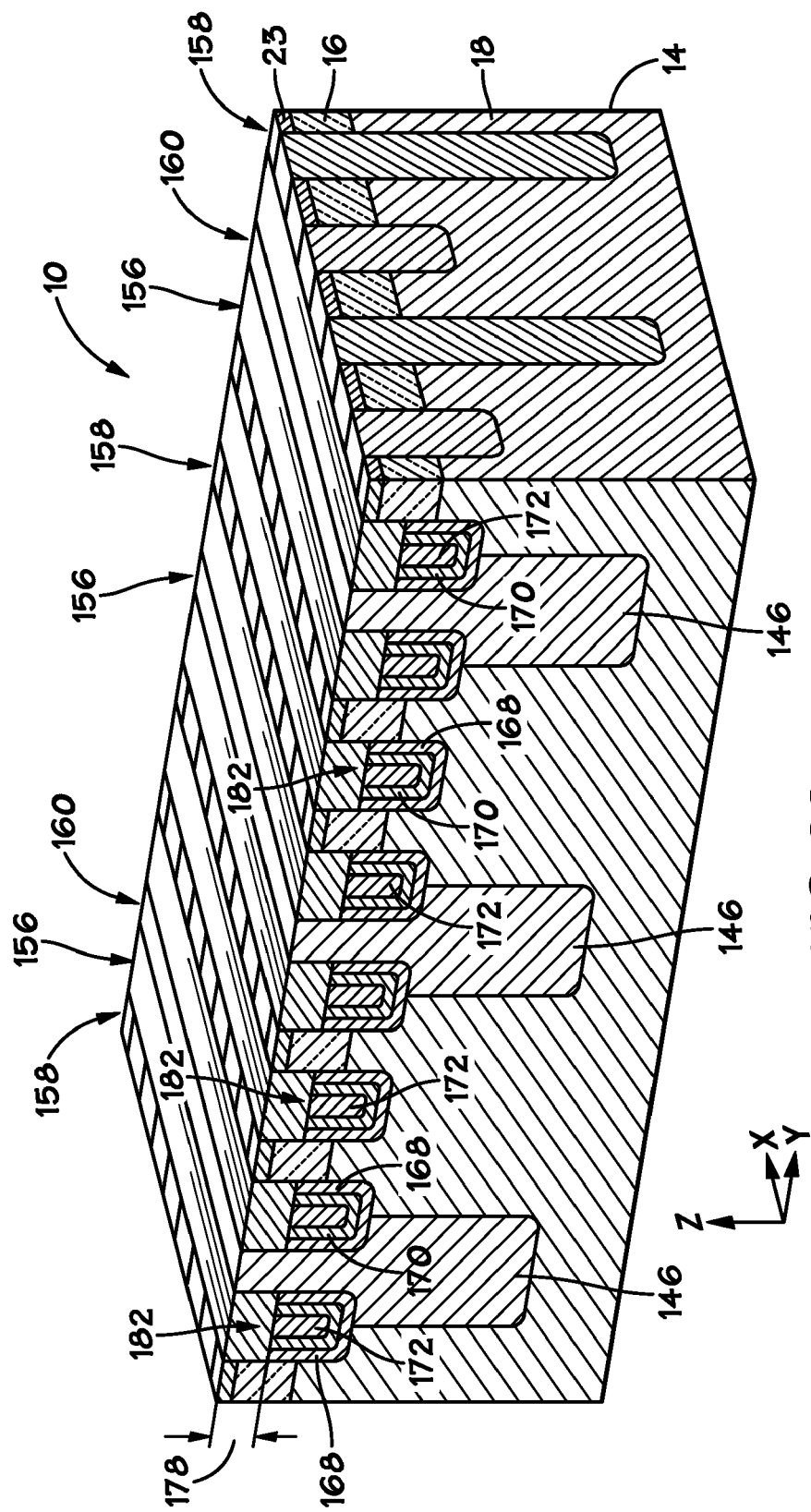

After forming the gates 174 and 176, a dielectric 182 may be formed on the array portion 10, as illustrated by FIG. 22. The dielectric 182 may be formed with an overburden and subsequently planarized to increase the likelihood of covering the gates 174 and 176. The dielectric 182 may include an oxide formed with TEOS CVD or other appropriate materials. Planarization may include processing the array portion 10 with a CMP process, an etch-back process, or other processes that planarize. The planarization process may stop on or in the upper doped region 16, removing the overburden of the dielectric 182.

The gates 174 may provide access lines (e.g., wordlines) for each of the fins 158. In contrast, the gates 176 may provide grounded gates for each fin 158. Thus, each fin 158 may include an access line gate 174 on one side of the fin 158 and a grounded gate 176 on the other side of the fin 158. The combination of gates 174 and 176 on either side of the fins 158 may be used to activate the transistors of the fins 158. Such a device may be referred to as a singled sided grounded gate "cross-hair cell" as each side of a fin is adjacent to an access line (e.g., gates 174) and a grounded gate (e.g., gates 176) that connect (i.e., forms a cross-point or cross-hair) with an access device (e.g., the transistors of fins 158) and uses a grounded gate 176 on one side of the fins 158.

Figure 23:
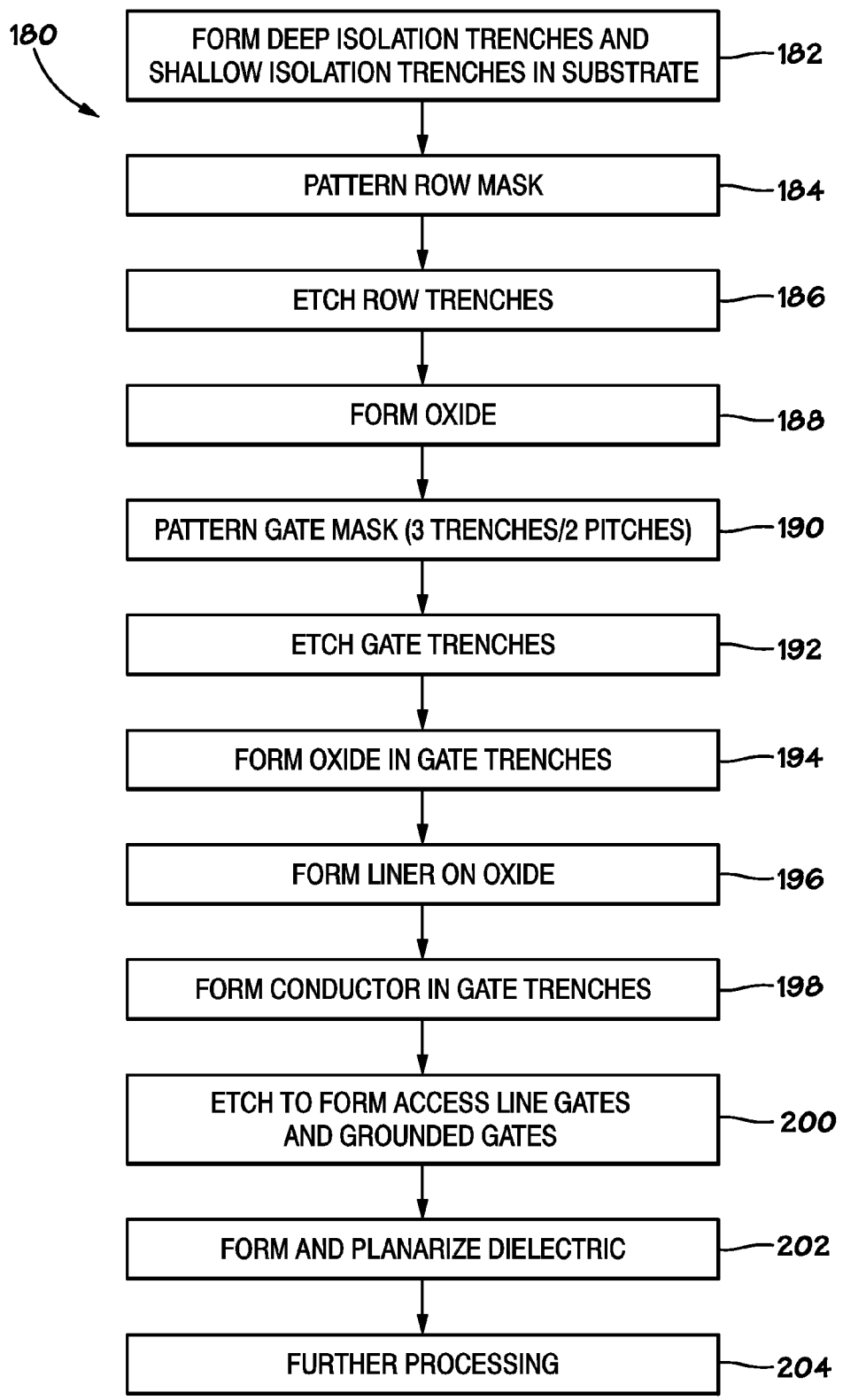
FIG. 23 is a flowchart depicting the manufacturing process of FIGS. 13-22 in accordance with an embodiment of the present invention.

FIG. 23 is a flowchart of a manufacturing process 180 in accordance with the embodiments depicted above in FIGS. 13-22. As described above in FIG. 15, deep isolation trenches 20 and shallow isolation trenches 22 may be formed in the substrate 14 by any suitable process (block 182). A row mask may be patterned on the array portion 10 (block 184), as shown in FIG. 13, and row trenches may be etched into the substrate to form row trenches and fins (block 186), as shown in FIG. 14. Next, the row trenches may be filled with an oxide 50 (block 188), as shown in FIG. 15.

After formation of the row trenches, a gate mask may be patterned on the array portion 10 (block 190), as shown in FIG. 16. As shown in FIG. 17, gate trenches may be etched into the substrate 14 to further define the fins (block 192). After formation of the gate trenches, an oxide may be formed in the gate trenches on the sidewalls and bottom surfaces of the gate trenches (block 194), as shown in FIG. 18. A liner may be formed on the oxide (block 196), and a conductor may be deposited in the gate trenches and on the liner (block 198), as shown in FIGS. 19 and 20. As depicted in FIG. 21, the conductor may be etched to a desired depth to form grounded gates and access line gates (block 200). After formation of the gates (block 200), a dielectric may be formed on the array portion 10 and the portion 10 may be planarized (block 202). As will be appreciated by those of ordinary skill in the art, the array portion 10 may be subjected to further processing, such as the formation of digitlines and storage devices accessible by the transistors of the fins 34 may be formed on the array portion 10 (block 204).

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating a semiconductor device, comprising:
   patterning a mask on a substrate, wherein the substrate comprises a plurality of fins and a plurality of row trenches, wherein each fin is separated from an adjacent fin by one of the plurality of row trenches; and
   forming a first plurality of gate trenches in the substrate, wherein each of the first plurality of gate trenches is formed over a portion of a respective one of the plurality of fins and a portion of a respective one of the plurality of row trenches;
   forming a first oxide in the first plurality of gate trenches;
   forming a first liner on the first oxide; and
   forming a first conductor in the first plurality of trenches.

2. The method of claim 1, comprising forming the plurality of row trenches in the substrate.

3. The method of claim 2, comprising filling an oxide in the plurality of row trenches.

4. The method of claim 1, wherein forming the first plurality of gate trenches comprises etching exposed regions of the mask.

5. The method of claim 1, wherein the first liner comprises titanium nitride or tungsten nitride.

6. The method of claim 5, wherein the first oxide comprises silicon dioxide or oxynitride.

7. The method of claim 6, wherein the first conductor comprises tungsten or ruthenium.

8. The method of claim 1, comprising forming a plurality of gates in the first plurality of gate trenches, wherein each pair of the plurality of gates comprises access lines of a respective one of the plurality of fins.

9. The method of claim 1, comprising forming a second plurality of gate trenches in the substrate, wherein each of the second plurality of gate trenches is formed over a portion of a respective one of the plurality of fins and separate from each respective one of the plurality of row trenches.

10. The method of claim 9, wherein forming the second plurality of gate trenches comprises etching exposed regions of the mask.

11. The method of claim 9, comprising forming a second oxide in the second plurality of gate trenches.

12. The method of claim 11, comprising forming a second liner on the second oxide.

13. The method of claim 12, comprising forming a second conductor in the second plurality of gate trenches.

14. The method of claim 9, comprising forming a plurality of gates in the second plurality of gate trenches, wherein each of the plurality of gates comprises a grounded gate of a respective one of the plurality of fins.

15. A method of fabricating a semiconductor device, comprising:
   forming a plurality of row trenches in a substrate at a first pitch; and
   forming a first plurality of gate trenches overlying and parallel to the plurality of row trenches, wherein at least four adjacent gate trenches of the plurality of gate trenches are formed at least partially within each pair of the plurality of row trenches;
   forming a second plurality of gate trenches parallel to the row trenches, wherein each respective gate trench of the second plurality of gate trenches is located between but separate from each of the row trenches.

16. The method of claim 15, wherein each pair of the first plurality of gate trenches defines a respective one of a plurality of fin field-effect transistors.

17. The method of claim 16, comprising forming a first plurality of gates in each pair of the first plurality of gate trenches, wherein each pair of the plurality of gates comprises access lines of a respective one of the fin field-effect transistors.

18. The method of claim 17, comprising forming a second plurality of gates in each respective gate trench of the second plurality of gate trenches, wherein each of the second plurality of gates comprises a grounded gate of a respective one of the plurality of fin field-effect transistors.

19. The method of claim 15, comprising:
   forming an oxide in the first plurality of gate trenches and in the second plurality of gate trenches;
   forming a liner on the oxide; and
   forming a conductor in the first plurality of gate trenches and in the second plurality of gate trenches.

* * * * *